US011183605B2

(12) United States Patent
Vogt et al.

(10) Patent No.: US 11,183,605 B2
(45) Date of Patent: Nov. 23, 2021

(54) METHOD FOR PRODUCING A LAYER STRUCTURE FOR THIN-FILM SOLAR CELLS USING ETCHING OR LASER ABLATION TO PRODUCE REAR-ELECTRODE-LAYER-FREE REGION

(71) Applicant: (CNBM) BENGBU DESIGN & RESEARCH INSTITUTE FOR GLASS INDUSTRY, Bengbu (CN)

(72) Inventors: Helmut Vogt, Munich (DE); Robert Lechner, Munich (DE)

(73) Assignee: (CNBM) BENGBU DESIGN RESEARCH INSTITUTE FOR GLASS INDUSTRY CO. LTD, Bengbu (CN)

( * ) Notice: Subject to any disclaimer, the term of this patent is extended or adjusted under 35 U.S.C. 154(b) by 0 days.

(21) Appl. No.: 16/605,793

(22) PCT Filed: Apr. 18, 2018

(86) PCT No.: PCT/CN2018/083473
§ 371 (c)(1),
(2) Date: Oct. 16, 2019

(87) PCT Pub. No.: WO2018/192512
PCT Pub. Date: Oct. 25, 2018

(65) Prior Publication Data
US 2020/0052138 A1 Feb. 13, 2020

(30) Foreign Application Priority Data

Apr. 19, 2017 (EP) .................... 17166982

(51) Int. Cl.
*H01L 31/0463* (2014.01)
*H01L 31/046* (2014.01)
(Continued)

(52) U.S. Cl.
CPC .......... *H01L 31/0463* (2014.12); *H01L 22/12* (2013.01); *H01L 31/046* (2014.12);
(Continued)

(58) Field of Classification Search
CPC ....... H01L 31/046; H01L 31/18; H01L 22/12; H01L 32/0463; G01N 23/2209
See application file for complete search history.

(56) References Cited

U.S. PATENT DOCUMENTS 5,593,901 A * 1/1997 Oswald ............... H01L 31/0463
438/80
5,626,688 A 5/1997 Probst et al.
(Continued)

FOREIGN PATENT DOCUMENTS

CN 1950952 A 4/2007
CN 103227243 A 7/2013
(Continued)

OTHER PUBLICATIONS

International Search Report for International Application No. PCT/CN2018/083473 filed on Apr. 18, 2018 on behalf of (CNBM) Bengbu Design & Research Institute dated Jul. 19, 2018 4 pages.
(Continued)

*Primary Examiner* — Michael Jung
(74) *Attorney, Agent, or Firm* — Bayramoglu Law Offices LLC

(57) ABSTRACT

A method for producing a layer structure for the production of thin-film solar cells including: providing a carrier substrate, depositing a rear electrode layer on the carrier substrate, producing a rear-electrode-layer-free region, creating a measurement layer over the rear electrode layer such that the measurement layer is situated at least over the rear-electrode-layer-free region, wherein the measurement layer is a photoactive absorber layer or a precursor layer of the
(Continued)

photoactive absorber layer, and determining a quantity or a relative share of a component of the measurement layer in a region of the measurement layer that is situated over the rear-electrode-layer-free region of the rear electrode layer.

18 Claims, 3 Drawing Sheets

(51) Int. Cl.
*H01L 31/18* (2006.01)
*H01L 21/66* (2006.01)
*G01N 23/2209* (2018.01)

(52) U.S. Cl.
CPC .......... *H01L 31/18* (2013.01); *G01N 23/2209* (2018.02); *G01N 2223/611* (2013.01); *G01N 2223/645* (2013.01)

(56) References Cited

U.S. PATENT DOCUMENTS

| | | | |
|---|---|---|---|
| 2002/0043279 | A1 | 4/2002 | Karg |
| 2008/0254202 | A1 | 10/2008 | Stolt et al. |
| 2011/0011453 | A1* | 1/2011 | Kang .................... H01L 31/046 136/256 |
| 2012/0031459 | A1* | 2/2012 | Kim .................... H01L 31/0475 136/244 |
| 2012/0273039 | A1* | 11/2012 | Pak .................... H01L 31/046 136/256 |
| 2013/0026588 | A1* | 1/2013 | Kubo .................. H01L 31/0465 257/431 |
| 2013/0118569 | A1* | 5/2013 | Lee .................... H01L 31/0463 136/256 |
| 2013/0146137 | A1* | 6/2013 | Morimoto ............. H01L 31/046 136/256 |
| 2013/0186461 | A1* | 7/2013 | Kim .................... H01L 31/0465 136/256 |
| 2014/0290741 | A1* | 10/2014 | Umesato ............. H01L 31/0368 136/258 |
| 2014/0332070 | A1* | 11/2014 | Sugimoto ......... H01L 31/03923 136/256 |
| 2015/0087103 | A1* | 3/2015 | Dunne ................ H01L 31/0463 438/68 |
| 2015/0118789 | A1* | 4/2015 | Suzuki .................... H01L 31/18 438/95 |
| 2015/0228820 | A1* | 8/2015 | Chen .................. H01L 31/0465 136/256 |
| 2016/0247947 | A1 | 8/2016 | Sung |
| 2016/0284882 | A1 | 9/2016 | Jang |

FOREIGN PATENT DOCUMENTS

| | | |
|---|---|---|
| CN | 105593998 A | 5/2016 |
| CN | 105794000 A | 7/2016 |
| DE | 19956735 B4 | 8/2008 |
| EP | 0715358 B1 | 6/2010 |

OTHER PUBLICATIONS

Palm J. et al., "CIS Module Pilot Processing Applying Concurrent Rapid Selenization and Sulfurization of Large Area Thin Film Precursors", *Thin Solid Films*, 431-432, pp. 514-522 (2003).
Written Opinion for International Application No. PCT/CN2018/083473 filed on Apr. 18, 2018 on behalf of (CNBM) Bengbu Design & Research Institute dated Jul. 19, 2018 5 pages.

* cited by examiner

METHOD FOR PRODUCING A LAYER STRUCTURE FOR THIN-FILM SOLAR CELLS USING ETCHING OR LASER ABLATION TO PRODUCE REAR-ELECTRODE-LAYER-FREE REGION

CROSS REFERENCE TO RELATED APPLICATIONS

The present application is the US national stage of International Patent Application PCT/CN2018/083473, filed internationally on Apr. 18, 2018, which claims priority to European Application No. EP17166982.3, filed on Apr. 19, 2017.

The present invention is in the technical area of the production of thin-film solar modules and relates to a method for producing a layer structure for the production of integrated serially connected thin-film solar cells, as well as a thin-film solar module produced using the method according to the invention.

Solar cells for the direct conversion of sunlight into electrical energy are well known. The term "thin-film solar cells" refers to layer systems with thicknesses of only a few microns that require carrier substrates for adequate mechanical stability. Known carrier substrates are made of glass, plastics (polymers), or metals and can, depending on the respective layer thickness and the specific material properties, be designed as rigid plates or flexible films. The carrier substrate can face the light incidence (superstrate configuration) or face away from the light incidence (substrate configuration).

The materials of the photoactive semiconductor layer (absorber layer) are selected such that the incident solar spectrum is utilized to the maximum. Due to the physical properties and the technical handling qualities, compound semiconductors of the chalcopyrite type (copper indium/gallium sulfide/selenide) and of the kesterite type (copper zinc tin sulfoselenide) are particularly suited for thin-film solar cells.

An important aspect in the production of thin-film solar cells is a strict adherence to the stoichiometry of the absorber layer, in other words, the composition of the absorber layer based on the type and amount of the elements involved, since this substantially influences the efficiency and other physical properties of the thin-film solar cells. Consequently, in the practice of series production, the problem presents itself that fluctuations in the composition of the absorber layer must be detected if specific quality requirements are to be met.

The relative share of elements in the absorber layer can be determined by x-ray spectroscopy, with wavelength dispersive x-ray spectroscopy (WDX) or energy dispersive x-ray spectroscopy (EDX) primarily used for this purpose. In these methods, the characteristic x-ray radiation of elements emitted by the absorber layer, for example, as a result of bombardment with electrons or of x-ray irradiation is detected and analyzed qualitatively and quantitatively or by relative shares of the elements contained. However, in practice, it has been demonstrated that the measured value of an element of the absorber layer is distorted by a signal from the rear electrode layer originating from the same element. For example, in the case of a chalcopyrite compound semiconductor, the signal for copper (Cu) in the absorber is distorted by a signal from the rear electrode layer if copper (Cu) is contained in the rear electrode layer. This is disadvantageous since the composition of the absorber cannot be determined with adequate precision in the context of process control.

The effect of the rear electrode layer has, to date, been taken into account, for example, in that a constant value has been subtracted from the signal for a specific element of the absorber, corresponding to an anticipated signal of the rear electrode layer. However, this is possible only to a limited extent since due to strict specifications, for example, for the content of copper (Cu), indium (In), and gallium (Ga) in a chalcopyrite absorber, the requirements for measurement accuracy are relatively high and the accuracy is already significantly reduced by inhomogeneities of the rear electrode layer. It would also be conceivable, for example, to measure the ratio of the elements gallium (Ga) to indium (In) and gallium (Ga), in other words, Ga/(In+Ga), and to use as an indirect measure for the ratio of copper (Cu) to indium (In) and gallium (Ga), i.e., Cu/(In+Ga), since, generally speaking, the relative Ga content, i.e., Ga/(Cu+Ga), is constant in the Cu/Ga targets used. Actually, there are also fluctuations in the target composition and the quantity of the doping material used changes the desired target value, which results, overall, in reduced accuracy. A further complication is the fact that, for example, the Ga intensity detected using EDX x-ray spectroscopy is relatively low.

In order to test the composition of the absorber with very high accuracy, so-called "witness glasses" must ultimately be produced, i.e., separate substrates that are provided only with the absorber layer, but not with the rear electrode layer, which, however, on the one hand, increases production costs and, at least in the case of in-line production systems in automated series production, is possible only with great effort. In addition, the carrier substrates provided for use are not tested individually such that, in principle, it cannot be guaranteed that the absorber of such a carrier substrate has the desired composition.

In contrast, the object of the present invention consists in making available a method for producing a layer structure for the production of integrated serially connected thin-film solar cells that enables reliable and accurate control of the composition of the absorber. The method should be usable in the automated series production of thin-film solar modules and enable economical production of thin-film solar modules with as few rejects as possible. These and other objects are accomplished according to the proposal of the invention by a method for producing a layer structure with the features of the independent claim. Advantageous embodiments of the invention are indicated through the features of the subclaims.

The method according to the invention serves for producing a layer structure that is intended for the manufacture of integrated serially connected thin-film solar cells. It comprises multiple steps that do not necessarily have to be performed in the order indicated, but can also be carried out in the order indicated in the following.

Thus, first, a carrier substrate that can be made of any material suitable for this purpose is prepared. The carrier material can, in particular, be made of glass, metal, plastic, or ceramic. Preferably, a transparent glass or plastic substrates is used.

Then, a rear electrode layer, i.e., a layer made of an electrically conductive material, from which rear electrodes of the thin-film solar cell are formed by patterning, is deposited on the carrier substrate. The rear electrode layer is arranged on the side of the optically active layer facing away from the incidence of light.

Then, at least one rear-electrode-layer-free region of the rear electrode layer is produced. A rear-electrode-layer-free region is a region or section of the rear electrode layer, in which no material of the rear-electrode-layer-free is present. Each rear-electrode-layer-free region is at least partially, in particular, completely, surrounded by material of the rear electrode layer, in other words, each rear-electrode-layer-free region is implemented in the form of a recess or discontinuity of the rear electrode layer. In the context of the present invention, residues of the rear electrode layer can still be situated in the rear-electrode-layer-free region, so long as measurement of the quantity or relative share of at least one component (element) of the measurement layer described in the following is not significantly impaired thereby. The at least one rear-electrode-layer-free region can be produced, for example, by masking at the time of deposition of the rear electrode layer. Preferably, the at least one rear-electrode-layer-free region is produced by decoating, i.e., subsequent removal after deposition of the rear electrode layer. This can be done, for example, by wet chemical etching. Preferably, decoating is done by laser ablation, wherein, in particular, laser pulses are used. By means of laser ablation, rear-electrode-layer-free regions can be produced simply and economically at different locations of the rear electrode layer. Particularly advantageous is the use of laser pulses with a maximum pulse duration in the range from 1 to 1000 picoseconds (ps), in particular 1 to 100 picoseconds (ps), by which means, as the inventors were able to demonstrate, virtually residue-free decoating of the rear electrode layer is possible without any special precautions. Also conceivable is, however, the use of laser pulses with longer pulse durations, in particular, in the range from at least one nanosecond. With such laser pulses, it is equally possible to achieve a low-residue or largely residue-free removal of the rear electrode layer through suitable laser guidance, for example, by means of an adequately large overlap of the areas irradiated by the laser pulses.

After formation of the at least one rear-electrode-layer-free region, a measurement layer is produced, wherein (at least) the at least one rear-electrode-layer-free region is overlaid by the measurement layer. Material of the measurement layer is situated over the at least one rear-electrode-layer-free region. The measurement layer is either a photoactive absorber layer or a precursor layer of the photoactive absorber layer. The precursor layer can be converted by thermal treatment into the absorber layer (two-stage method).

Then, an absolute quantity or a relative share (content) of at least one component (element) of the measurement layer is determined exclusively in a region of the measurement layer that is situated (directly) above the at least one rear-electrode-layer-free region. The region of the measurement layer that is situated directly above the rear-electrode-layer-free region of the rear electrode layer (in other words, in view or projection perpendicular to the flat carrier substrate) and serves for measurement, is also referred to here and in the following as "measurement field". In particular, in this manner, the composition of the measurement layer is determined. A measurement is done exclusively in the measurement field and no measurement is done outside the measurement field. Preferably used for this measurement is a method based on x-ray spectroscopy, for example, wavelength dispersive x-ray spectroscopy (WDX) or energy dispersive x-ray spectroscopy (EDX), wherein, preferably, excitation by x-ray irradiation is done.

For a particularly advantageous use of the method according to the invention, the measurement layer includes at least one component (element) that is also included in the material of the rear electrode layer. Advantageously, in the method according to the invention, a quantity or a relative share of at least this component that is included both in the measurement layer and also in the rear electrode layer is determined. Of course, quantities or relative shares of components (elements) of the measurement layer that are not included in the rear electrode layer can likewise be determined. Typically, the measurement layer includes no molybdenum, is thus molybdenum free. Thus, no determination of the quantity of molybdenum in the measurement layer is done. Preferably, the quantity or the relative content of copper (Cu) and/or zinc (Zn) in the measurement layer is determined.

The material of the measurement layer preferably includes a compound semiconductor or, if the measurement layer is a precursor layer, elements of a precursor layer for production of a compound semiconductor. Preferably, but not mandatorily, the measurement layer includes a chalcopyrite compound semiconductor or elements of a precursor layer for producing a chalcopyrite compound semiconductor, in particular $Cu_2ZnSn(S,Se)_4$, $Cu(In,Ga,Al)(S,Se)_2$, $CuInSe_2$, $CuInS_2$, $Cu(In,Ga)Se_2$, or $Cu(In,Ga)(S,Se)_2$. The elements indicated in parentheses in the above formulas can be present either alone or in combination. In an advantageous embodiment of the measurement layer, it is made of a chalcopyrite compound semiconductor or elements of a precursor layer for producing a chalcopyrite compound semiconductor. The measurement layer can equally preferably include a compound semiconductor of the kesterite type (copper-zinc-tin-sulfoselenide, abbreviated CZTS) or elements of a precursor layer for producing a kesterite compound semiconductor or be made of such a kesterite compound semiconductor or elements of a precursor layer for producing such a kesterite compound semiconductor. The precursor layers can in each case be converted by thermal treatment to form a compound semiconductor.

Expediently, the absorber layer is produced on the rear electrode layer by a two-stage process. Here, a precursor layer (which can include a plurality of individual layers) is first deposited on the rear electrode layer. The precursor layer includes, for example, the elements copper, indium, and gallium, which are, for example, applied by sputtering. At the time of the coating with the precursor layer, a metered dose of sodium can optionally be selectively introduced into the precursor layer, as, for example, is known from EP 715 358 B1. Furthermore, the precursor layer includes, for example, elemental selenium, which is applied, for example, by thermal vaporization. During the deposition processes, the temperature of the carrier substrate is, generally speaking, below 100° C. such that the elements remain substantially unreacted. Then, this precursor layer is reacted in rapid thermal processing (RTP), for example, in a sulfur-containing atmosphere to form a chalcopyrite compound semiconductor. The thermal treatment causes crystallization and phase transformation of the precursor layer to form the actual semiconductor layer. Such a two-stage method is known, for example, from J. Palm et al., "CIS Module Pilot Processing Applying Concurrent Rapid Selenization and Sulfurization of Large Area Thin Film Precursors", Thin Solid Films 431-432, pp. 414-522 (2003).

The material of the rear electrode layer preferably includes copper (Cu) and/or zinc (Zn).

The method according to the invention can be used with particularly high benefit for layer systems in which the measurement layer includes a chalcopyrite compound semiconductor and/or kesterite compound semiconductor or a precursor layer of a chalcopyrite compound semiconductor and/or a precursor layer of a kesterite compound semiconductor and the rear electrode layer includes copper (Cu) and/or zinc (Zn), wherein at least one component of the measurement layer (e.g., Cu and/or Zn) is also included in the rear electrode layer.

The method according to the invention advantageously enables an accurate determination of the quantity or of the relative share (content) of one or a plurality of components of the measurement layer, in that a measurement occurs only in the regions of the measurement layer that are situated in each case in the measurement field directly above a rear-electrode-layer-free region. A distortion of the measurement results or components of the measurement layer that are also present can thus be avoided. The method can be unproblematically integrated into the time sequence of the production of thin-film solar modules, by which means costs can advantageously be saved. Particularly advantageously, the method according to the invention enables accurate process control of the absorber in a actual thin-film solar module intended for use, in contrast to a witness glass produced solely for measurement purposes and thus allows, for the first time, accurate quality control of the thin-film solar module itself.

Preferably, a plurality of rear-electrode-layer-free regions is produced in the rear electrode layer such that the quantity or the content of at least one component of the measurement layer at different locations of the measurement layer can be determined reliably and with certainty, in each case above a rear-electrode-layer-free region. In this manner, a possible fluctuation of the component analyzed in the measurement layer can be recorded such that even the homogeneity of the measurement layer can be verified. Thus, particularly high quality requirements can be met.

For example, a plurality of rear-electrode-layer-free regions are arranged along a transport direction of the carrier substrate for depositing the materials of the measurement layer (i.e., coating direction), as a result of which good control of the measurement layer is possible. Particularly advantageously, a plurality of rear-electrode-layer-free regions are arranged transverse to the transport direction of the carrier substrate. In practice, it has been shown that fluctuations in the composition of the measurement layer occur primarily transverse to the transport direction such that, through this measure, a particularly important process control is possible. For example, the rear-electrode-layer-free regions are arranged in a row, in particular evenly distributed. Advantageously, the rear-electrode-layer-free regions are arranged distributed over the complete dimension of the carrier substrate along and/or transverse to the transport direction.

The at least one rear-electrode-layer-free region is advantageously arranged in an edge region of the carrier substrate or thin-film solar module provided for (complete) decoating, which edge region is optically not active and surrounds the solar cells. This has the advantage that the optically active area is not reduced by the rear-electrode-layer-free regions.

Possible and advantageous is, however, also an arrangement of the at least one rear-electrode-layer-free region inside the region of the measurement layer provided for photoelectric energy production. To be sure, this causes a reduction in the optically active area; however, the composition of the measurement layer can be detected not only in the edge region of the thin-film solar module, but also in the optically active interior, as a result of which particularly high quality requirements can be met. The effects on the electrical properties can be mitigated by producing relatively small rear-electrode-layer-free regions. Advantageously, a longest or largest dimension of the at least one rear-electrode-layer-free region, or of all rear-electrode-layer-free regions, has a maximum size of 10 mm, in particular a maximum of 5 mm. For example, the largest dimension is in the range from 1 to 10 mm, in particular 1 to 5 mm. Advantageously, a shortest or smallest dimension of the at least one rear-electrode-layer-free region, or of all rear-electrode-layer-free regions, has a size of at least 1 mm. The at least one rear-electrode-layer-free region is preferably not implemented linear, with, in the context of the invention, "a linear dimension" meaning a ratio of the largest dimension to the smallest dimension of at least 100:1, in particular more than 10:1.

The at least one rear-electrode-layer-free region is different from a patterning line (P1, P2, P3 line) for patterning the serial connection of two adjacent solar cells. Typically, the patterning lines for the serial connection of two adjacent solar cells include one patterning line (P1 line) dividing at least rear electrode layer, one patterning line (P2 line) dividing at least the photovoltaically active absorber layer, and one patterning line (P3 line) dividing at least the front electrode layer.

The at least one rear-electrode-layer-free region does not completely divide the rear electrode layer into two rear electrode layer regions spatially separated from one another. In particular, the at least one rear-electrode-layer-free region is not a P1 line completely dividing the rear electrode layer.

Advantageously, a plurality of rear-electrode-layer-free regions are arranged in a row along at least one straight line, with the straight line not being parallel to the patterning lines (P1, P2, P3 line), in other words, at an angle different from 0°, for example, perpendicular, relative to the patterning lines (P1, P2, P3 line). The at least one linear arrangement of rear-electrode-layer-free regions can be situated in the edge region of the carrier substrate or thin-film solar module provided for (complete) decoating, which edge region is optically not active and surrounds the solar cells. It is, however, also possible for the at least one linear arrangement of rear-electrode-layer-free regions to be situated at least partially, in particular completely, inside the edge region, in particular in the region of the measurement layer provided for photoelectric energy generation.

It can be advantageous in terms of equal generation of current by solar cells for a rear-electrode-layer-free region to be situated in each case in the photovoltaically active regions of the solar cells, with the rear-electrode-layer-free regions of the solar cells having an equal area. Accordingly, it is advantageous for a plurality of rear-electrode-layer-free regions with a combined total area to be situated in each case in the solar cells, with the total areas equal.

If not explicitly indicated, in the context of the present invention, the arrangement of a layer "over/above" or "on" another layer does not mean that the layers have to be directly on one another. The same applies to the arranging of a layer "on" or "over/above" the carrier substrate. At least one other layer can be situated between a layer and a layer arranged on this layer. Accordingly, at least one other layer can be situated between the carrier substrate and a layer arranged on the carrier substrate. The term "layer" can describe an individual layer made of one and the same material, but also extends to a plurality of individual layers arranged atop one another, wherein at least two immediately adjacent single layers can be made, for differentiation, from materials different from one another. For example, the rear electrode layer and/or the measurement layer can in each case be made of one or a plurality of mutually different individual layers.

For producing the rear electrode layer and measurement layer, all chemical-physical deposition methods are, in principle, suitable, for example, chemical vapor deposition (CVD), physical vapor deposition (PVD), sputtering (cathodic sputtering), or thermal vaporization.

The method according to the invention for producing a layer system can be used in the production of integrated serially connected thin-film solar cells and a thin-film solar module manufactured therewith. Of course, the production of integrated serially connected thin-film solar cells includes additional steps, for example, the deposition of a front electrode layer and one or a plurality of buffer layers as well as steps for patterning the various layers, which are, however, unnecessary for the understanding of the invention and, consequently, require no more detailed explanation.

The invention further extends to a thin-film solar module that is produced using the method according to the invention. In particular, one or a plurality of rear-electrode-layer-free regions can be arranged within the optically active part of the thin-film solar module.

BRIEF DESCRIPTION OF THE DRAWINGS

The invention is now explained in detail using an exemplary embodiment with reference to the accompanying figures. They depict.

DETAILED DESCRIPTION OF THE DRAWINGS

Figure 1:
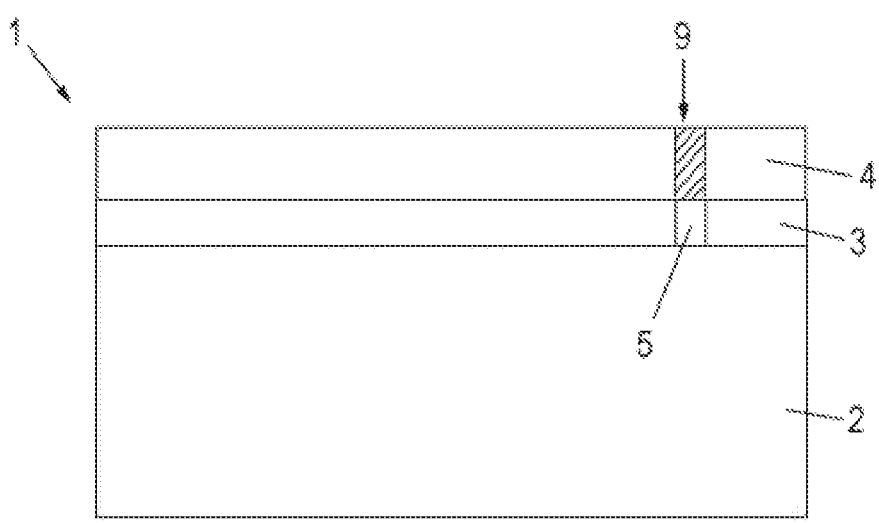
FIG. 1 a schematic cross-sectional view along the section line A-A of FIG. 2 of a layer structure that is an intermediate product for production of thin-film solar cells.
Figure 2:
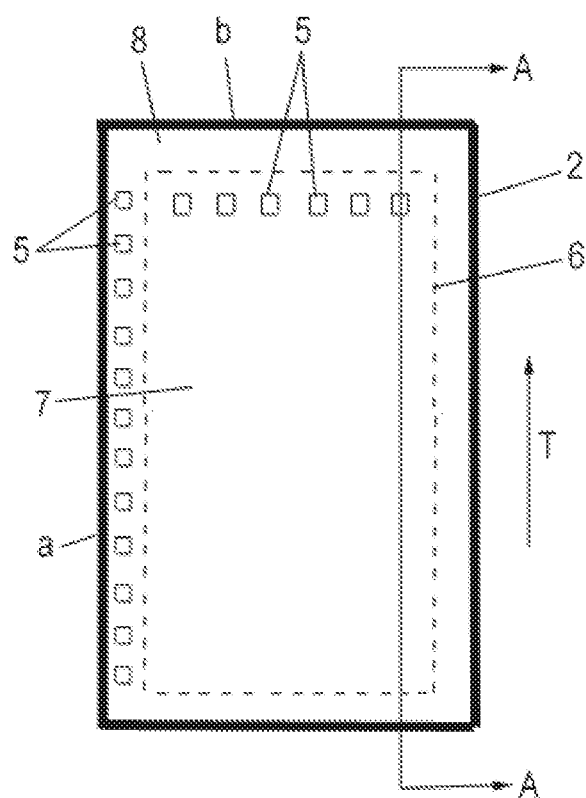
FIG. 2 a plan view of the layer structure of FIG. 1.

Considering, first, FIGS. 1 and 2, which depict purely schematically an exemplary layer structure 1 for illustrating the method according to the invention. The layer structure 1 is an intermediate product in the production of integrated serially connected thin-film solar cells.

The layer structure 1 comprises a substrate 2 and a rear electrode layer 3 on the substrate 2. A measurement layer 4 is arranged on the rear electrode layer 3, which is either a photoactive absorber layer or a precursor layer of the photoactive absorber layer.

The substrate 2 here is made, for example, of inorganic glass, while other insulating materials with satisfactory stability, as well as inert behavior relative to the process steps carried out in the production of thin-film solar cells can equally be used, for example, plastics, in particular polymers or metals or metal alloys. Depending on the layer thickness and the specific material properties, the substrate 2 can be designed as a rigid plate or flexible film. The layer thickness of the substrate 2 is, for example, from 1 mm to 5 mm. The rear electrode layer 3 is arranged on the surface of the substrate 2 facing light incidence. The rear electrode layer 3 is made, for example, of a light-impermeable metal. It can be deposited on the substrate 2, for example, by vapor deposition or magnetron enhanced cathodic sputtering. The rear electrode layer 3 contains or is made of, for example, copper (Cu) and/or zinc (Zn) or consists of a multilayer system with such a metal. The layer thickness of the rear electrode layer 3 is, for example, less than 1 μm and is in particular in the range from 300 nm to 600 nm. After patterning, the rear side contacts of the thin-film solar cells are formed in the rear electrode layer 3. An alkali barrier, which is made, for example, of $Si_3N_4$, SiON, or SiCN, can be arranged between the substrate 2 and the rear electrode layer 3. This is not shown in FIG. 1.

The measurement layer 4 is, for example, a photoactive absorber layer and includes or is made preferably of a chalcopyrite compound semiconductor, in particular $Cu_2ZnSn(S,Se)_4$, $Cu(In,Ga,Al)$ $(S,Se)_2$, $CuInSe_2$, $CuInS_2$, $Cu(In,Ga)Se_2$, or $Cu(In,Ga)$ $(S,Se)_2$ or a kesterite compound semiconductor (CZTS). Preferably, the measurement layer 4 includes or is made of $Cu(InGa)(S,Se)_2$ and was produced, for example, by the previously described two-stage RTP process. The measurement layer 4 can, equally, be a precursor layer of such an absorber layer (optionally consisting of multiple layers), which is converted by thermal treatment to form the compound semiconductor. The measurement layer 4 is applied directly onto the rear electrode layer 3. The measurement layer 4 has, for example, a thickness of 1.5 μm.

Typically, at least one buffer layer (not shown), which includes, for example, undoped zinc oxide (i-ZnO), is arranged on the measurement layer 4. Above that is situated a front electrode layer (not shown), which is transparent to radiation in the visible spectral range and in which, after patterning, the front side contacts of the thin-film solar cell are formed. Usually, a cover layer (not shown) for protection against environmental influences is applied on the front electrode, made, for example, of polyvinyl butyral (PVB), ethylene vinyl acetate (EVA), or a plastic layer made of silicones (encapsulation film). In addition, a cover plate (not shown) transparent to sunlight can be provided. For the production of integrated serially connected thin-film solar cells, the rear electrode layer 3, as well as the front electrode layer (not shown) are patterned in a manner known per se by patterning lines P1, P2, and P3 (P1 to divide the rear electrode layer, P2 for contact of the front electrode section and the rear electrodes section, and P3 for separating the front electrode layer.

The layer structure described for producing thin-film solar cells, whose intermediate product is depicted in FIGS. 1 and 2, is well known to the person skilled in the art and has already been described in detail in numerous publications of the patent literature, for example, in DE 19956735 B4.

In the substrate configuration depicted in FIG. 1, the rear electrode layer 3 is adjacent the substrate 2. Of course, the layer structure 1 can, equally, have a superstrate configuration in which the substrate 2 is transparent and is arranged on the light-entry side.

For example, the carrier substrate 2 is coated, in an in-line production system, with the rear electrode layer 3 and the measurement layer 4, wherein the carrier substrate 2 is moved for this purpose along a transport direction T, which is symbolized in FIG. 2 by an arrow. When the measurement layer 4 is a precursor layer of the absorber layer, the measurement layer 4 is then thermally converted to the absorber layer.

As discernible in FIG. 2, the carrier substrate 2 is rectangular, with a longer dimension a and a shorter dimension b, wherein, for example, the longer dimension a extends in the transport direction T. The surface of the carrier substrate 2 is completely coated with the rear electrode layer 3 and the measurement layer 4, in other words, the rear electrode layer 3 covers the carrier substrate 2 completely, and the measurement layer 4 covers the rear electrode layer 3 completely. By means of the imaginary separating line 6 shown in FIG. 2, the optically active region 7 of the thin-film solar cells provided for photoelectric energy generation is separated from an edge region 8, in which the carrier substrate 2 is completely decoated at a later point in time. In the intermediate product in the production of the thin-film solar cells depicted in FIGS. 1 and 2, the rear electrode layer 3 and the measurement layer 4 are present both in the optically active region 7 and in the edge region 8.

In layer structure 1, the rear electrode layer 3 has a plurality of rear-electrode-layer-free regions 5 that are implemented in each case in the form of a recess (discontinuity) of the rear electrode layer 3. Accordingly, the rear-electrode-layer-free regions 5 are in each case situated within an outer border of the rear electrode layer 3 and are in each case surrounded by material of the rear electrode layer 3. The rear-electrode-layer-free regions 5 have, here, for example, a rectangular shape, with a different shape being equally possible. The measurement layer 4 overlays all rear-electrode-layer-free regions 5.

As shown in FIG. 2, a plurality of rear-electrode-layer-free regions 5, which can optionally be present, are implemented in the rear electrode layer 3. For example, a plurality of rear-electrode-layer-free regions 5 are implemented in the (later) optically active region 7 and/or in the (later) decoated edge region 8. The rear-electrode-layer-free regions 5 are arranged, for example, transverse to the transport direction T of the carrier substrate 2, i.e., here, for example, along the shorter dimension b of the carrier substrate 2, and/or along the transport direction T of the carrier substrate 2, i.e., here, for example, along the longer dimension a of the carrier substrate 2.

The rear-electrode-layer-free regions 5 are in each case produced by decoating the rear electrode layer 3 by a pulsed laser beam (laser ablation) preferably with a pulse duration in the range from 1 to 1000 picoseconds.

Above each rear-electrode-layer-free region 5 is situated a region of the measurement layer 4, referred to in the following as "measurement field" 9, wherein only in measurement field 9 is a measurement of the quantity or content (relative share) of one or a plurality of elements of the measurement layer 4 done. In FIG. 1, the measurement field 9 of the measurement layer 4 is identified by hatching.

Figure 5:
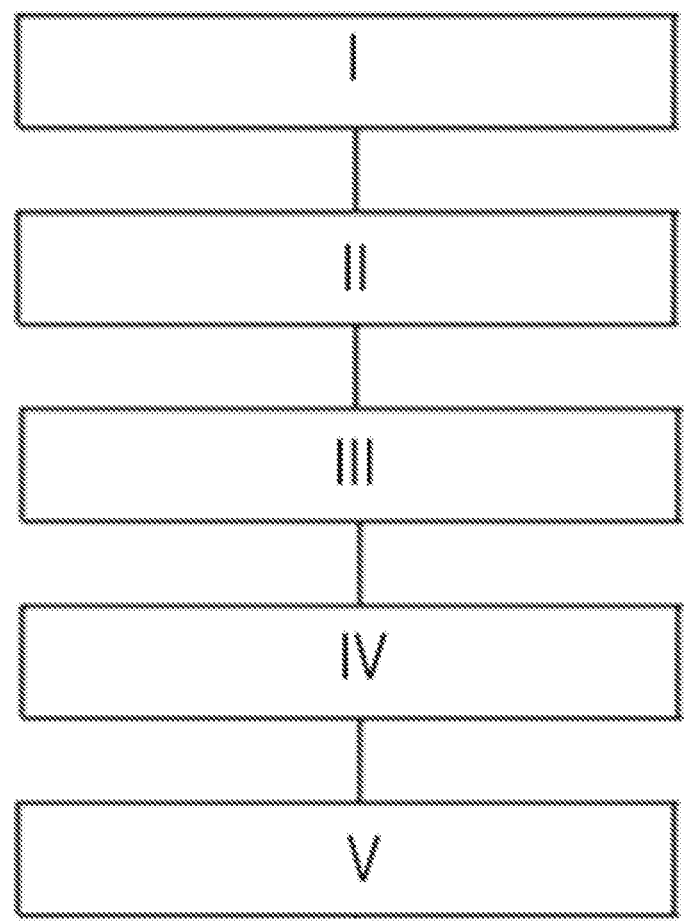
FIG. 5 an exemplary embodiment of the process steps using a flowchart.

The preparation of the layer structure 1 of FIGS. 1 and 2 is part of the method according to the invention, as it is illustrated with reference to the flowchart of FIG. 5. Accordingly, first, the carrier substrate 2 is prepared (step I). Then, the rear electrode layer 3 is applied on the carrier substrate 2 (step II). This is followed by the formation of the rear-electrode-layer-free regions 5 in the rear electrode layer 3 (step III) as well as the production of the measurement layer 4 (step IV). Then, the quantity or a relative content of at least one component (element) of the measurement layer 4 is determined in the measurement fields 9 of the measurement layer 4 situated in each case above a rear-electrode-layer-free region 5 (step V). No such measurement occurs outside the measurement fields 9.

In particular, in step V, the accurate composition of the measurement layer 4 is determined, for example, the amount or the content of the elements Cu, In, and Ga. This can be done with particularly high accuracy even if, for example, Cu is contained in the rear electrode layer 3. Wavelength dispersive x-ray spectroscopy (WDX) or energy dispersive x-ray spectroscopy (EDX) is used, for example, wherein preferably excitation through irradiation with x-ray radiation is done. A distortion or interference of the measurement signal for an element of the measurement layer 4 by the same element that is present in the rear electrode layer can advantageously be avoided by exclusive measurement in the measurement fields 9 above the rear-electrode-layer-free regions 5.

Figure 3:
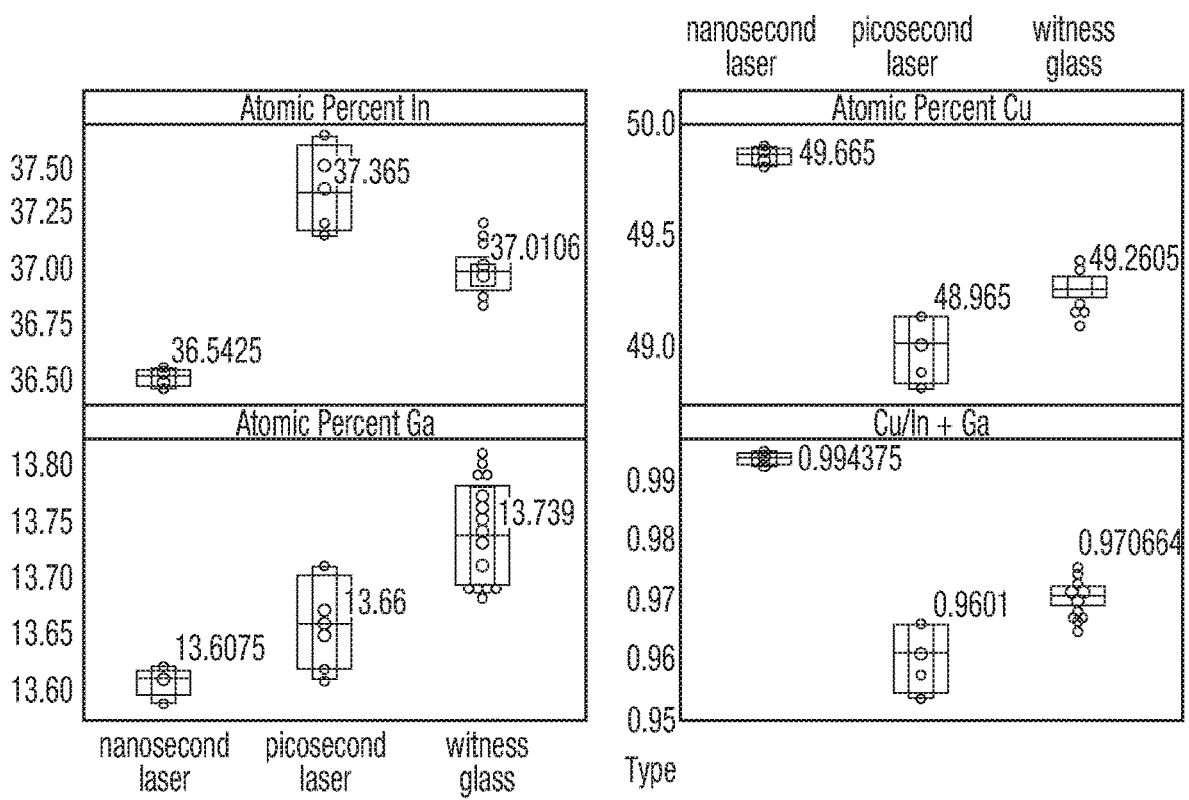
FIG. 3 a box plot for presenting the relative shares of various elements of the absorber layer with two carrier substrates and a witness glass.

FIG. 3 depicts a box plot for comparison of the percentage shares of various elements in the precursor layer of various specimens. Measurements were made on a witness glass with a precursor layer and a missing rear electrode layer, as well as in measurement fields on carrier substrates with a rear electrode layer containing copper (Cu), wherein below the measurement fields, the rear electrode layer was removed with two different lasers (picosecond laser and nanosecond laser). The left figure records the percentage share (atom-%) of In and Ga for the various specimens. The right figure records the percentage share (atom-%) of Cu and the ratio Cu/(In+Ga) for the various specimens. The measurement was carried out with WDX x-ray spectroscopy.

Discernibly, the ratio Cu/(In+Ga) in the measurement fields with the rear electrode layer removed by the ps laser is close to the values that were measured for the witness glass. In contrast, in the measurement fields processed with the ns laser, the ratio is significantly higher due to still present Cu residues. The ps laser used in this experiment is thus particularly suitable for the correct determination of the Cu/(In+Ga) ratio, while the laser guidance of the ns laser could be optimized, e.g., by higher pulse to pulse overlap or higher power. However, in principle, ns lasers are also suitable. The Cu/(In+Ga) ratio has, for the ps laser process, a deviation of 1% and, for the ns laser process, a deviation of 2% from the value measured for the witness glass. The cause of this is probably a relatively high residue presence of Cu for the ns process. It is to be anticipated that through adjustment of the laser process a significant improvement can still be achieved here. For the ps laser process, the Cu values and measured Cu/(In—Ga) ratio are, in contrast, slightly lower than the values of the witness glasses, which confirms that adequate decoating is ensured.

The results were additionally supported by lock-in-infrared-analyses on the specimens indicating local ohmic losses. The measurement fields were discernible here as non-active regions, but indicated no increased ohmic losses.

The measurement layer was further analyzed microscopically in the region of the measurement fields. In these regions, some growth defects and minimal microscopic spalling were, to be sure, discernible, dependent in each case on the laser method used; however, these regions seemed noncritical electrically, at least under the light microscope, since they were located in regions that could not result in a conducting connection between the front and rear electrode in the final module, and thus in partial short-circuits. The infrared analysis confirmed this assessment.

The experiment shows that the method according to the invention can be used not only in regions of the thin-film solar modules not optically active later, but also in the optically active area.

Figure 4:
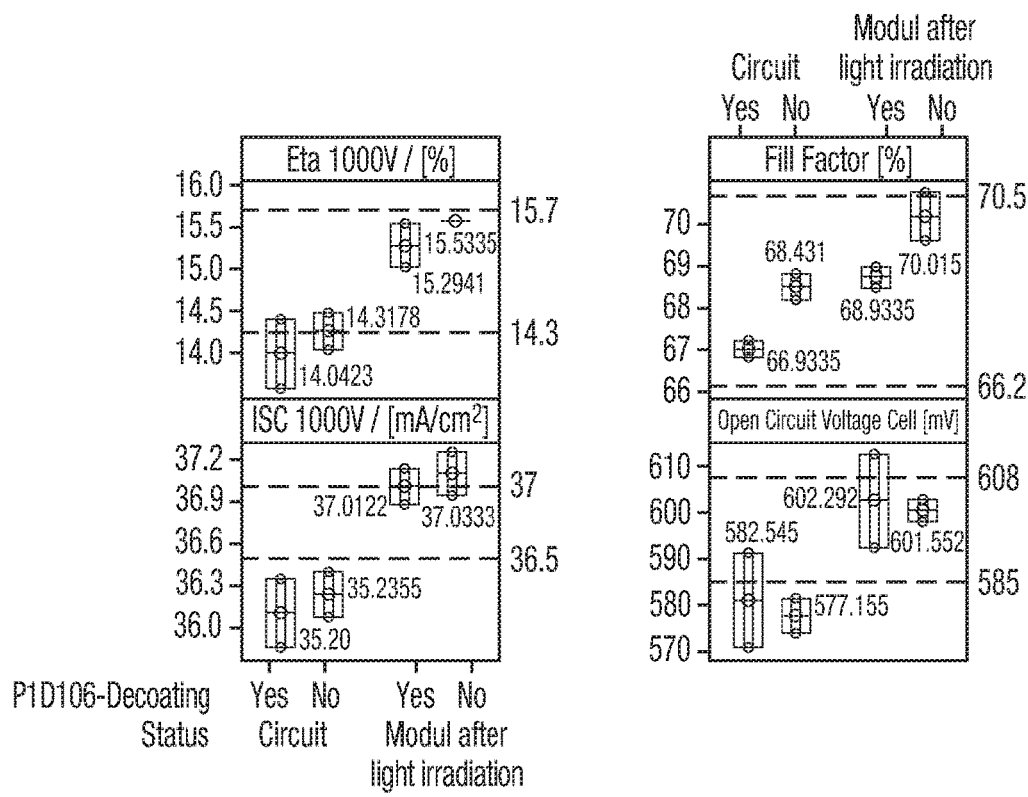
FIG. 4 a box plot for presenting various physical parameters with carrier substrates with and without measurement fields.

FIG. 4 shows IU characteristics of thin-film solar modules with and without measurement fields on carrier substrates with a Cu-containing rear electrode of the thin-film solar cells. Within multiple thin-film solar cells, the rear electrode was removed in the optically active area with two different lasers. In each case, 30×30 $cm^2$ carrier substrates were produced with and without measurement fields in the optically active area. Box plots are shown for the measurement values of efficiency Eta, the short-circuit current density ISC, the open circuit voltage per solar cell in the module Voc, as well as the fill factor FF. A distinction is made between thin-film solar modules with encapsulation ("Circuit") as well as after encapsulation and light aging ("Module after LS"). A further distinction is made depending on the presence of measurement fields ("Yes") or absence of measurement fields ("No"). The significance bars of the box plot show that there is no substantial influence of the measurement fields on efficiency, although in this case, multiple measurement fields were actually realized on a relatively small area. The effects are thus negligible on typical products with a module area of approx. 1 m².

From the above statements, it has become clear that by means of the present invention, the disadvantages of prior art methods for control of the composition of the absorber layer or its precursor layer can be overcome. The elements of the measurement layer can be verified reliably and with certainty via the rear-electrode-layer-free regions without a distorting signal of the rear electrode layer. The quality of the thin-film solar module is itself not substantially impaired when the rear-electrode-layer-free regions are in the optically active region of the thin-film solar module. The influence of a residue presence in the rear-electrode-layer-free regions is negligible, at least in the case of measurements using WDX or EDX x-ray spectroscopy. There is the added fact that the signal of a residue presence is damped by the measurement layer lying above the rear-electrode-layer-free regions. Problems with reduced adhesion of the precursor layer or the absorber layer produced therefrom by thermal conversion have not been observed in the rear-electrode-layer-free regions. It has likewise not been observed that a barrier layer made, for example, of silicon nitride (SiN) and situated on the carrier substrate disadvantageously affects the growth of the precursor layer or absorber layer in the rear-electrode-layer-free regions. The method according to the invention can, consequently, be used advantageously in the production of thin-film solar cells.

LIST OF REFERENCE CHARACTERS 1 layer structure
2 carrier substrate
3 rear electrode layer
4 measurement layer
5 rear-electrode-layer-free region
6 separating line
7 photoactive region
8 edge region
9 measurement field

What is claimed is:

1. A method for producing a layer structure for the production of thin-film solar cells, comprising:
   providing a carrier substrate;
   depositing a rear electrode layer on the carrier substrate;
   producing at least one rear-electrode-layer-free region;
   creating a measurement layer over the rear electrode layer such that the measurement layer is situated at least over the at least one rear-electrode-layer-free region,
     wherein the measurement layer is a photoactive absorber layer or a precursor layer of the photoactive absorber layer; and
   determining a quantity or a relative share of at least one component of the measurement layer in a portion of the measurement layer, which is situated over the at least one rear-electrode-layer-free region of the rear electrode layer.

2. The method according to claim 1, wherein the at least one rear-electrode-layer-free region is produced by decoating the rear electrode layer.

3. The method according to claim 2, wherein the at least one rear-electrode-layer-free region is produced by wet chemical etching or by laser ablation.

4. The method according to claim 3, wherein the at least one rear-electrode-layer-free region is decoated by a pulsed laser beam with a pulse duration of 1 to 1000 picoseconds.

5. The method according to claim 3, wherein the at least one rear-electrode-layer-free region is decoated by a pulsed laser beam with a pulse duration of 1 to 100 picoseconds.

6. The method according to claim 1, wherein a longest dimension of the at least one rear-electrode-layer-free region has a maximum size of 10 mm.

7. The method according to claim 1, wherein a plurality of rear-electrode-layer-free regions is produced.

8. The method according to claim 7, wherein the rear-electrode-layer-free regions are arranged along a transport direction of the carrier substrate for depositing the measurement layer.

9. The method according to claim 7, wherein the rear-electrode-layer-free regions are arranged transverse to a transport direction of the carrier substrate for depositing the measurement layer.

10. The method according to claim 7, wherein the rear-electrode-layer-free regions are arranged in one or a plurality of rows near one another.

11. The method according to claim 10, wherein the rear-electrode-layer-free regions are evenly distributed in each row.

12. The method according to claim 1, wherein the rear-electrode-free region is arranged in an edge region of the carrier substrate provided for complete decoating.

13. The method according to claim 1, wherein the rear-electrode-free region is arranged in a region of the carrier substrate provided for photoelectric energy generation.

14. The method according to claim 1, wherein at least one same component is contained in the measurement layer and in the rear electrode layer.

15. The method according to claim 1, wherein the measurement layer contains a chalcopyrite compound semiconductor, and/or a kesterite compound semiconductor (CZTS) or a precursor layer of the chalcopyrite compound semiconductor and/or a precursor layer of the kesterite compound semiconductor, and wherein the rear electrode layer contains Cu and/or Zn.

16. The method according to claim 15, wherein the chalcopyrite compound semiconductor is selected from the group consisting of $Cu_2ZnSn(S,Se)_4$, $Cu(Tn,Ga,Al)(S,Se)_2$, $CuInSe_2$, $CuInS_2$, $Cu(In,Ga)Se_2$, and $Cu(In,Ga)(S,Se)_2$.

17. The method according to claim 1, wherein the materials of the measurement layer are thermally converted, wherein the quantity or the relative share of at least one component of the measurement layer is determined before the thermal conversion of the measurement layer.

18. The method according to claim 1, wherein a longest dimension of the at least one rear-electrode-layer-free region has a maximum size of 5 mm.

* * * * *